(12) United States Patent
Li et al.

(10) Patent No.: US 10,564,684 B1
(45) Date of Patent: Feb. 18, 2020

(54) INPUT/OUTPUT PANEL ASSEMBLY

(71) Applicant: HONGFUJIN PRECISION ELECTRONICS (TIANJIN) CO.,LTD., Tianjin (CN)

(72) Inventors: Cheng-He Li, Tianjin (CN); Kai-Dong Wang, Tianjin (CN)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 16/281,307

(22) Filed: Feb. 21, 2019

(30) Foreign Application Priority Data

Nov. 6, 2018 (CN) .......................... 2018 1 1314852

(51) Int. Cl.
| | |
|---|---|
| *H01R 13/447* | (2006.01) |
| *H05K 5/02* | (2006.01) |
| *G06F 1/18* | (2006.01) |
| *H05K 7/14* | (2006.01) |
| *H01R 13/24* | (2006.01) |
| *H01R 13/518* | (2006.01) |
| *H01R 13/627* | (2006.01) |
| *H01R 13/506* | (2006.01) |

(52) U.S. Cl.
CPC ......... *G06F 1/183* (2013.01); *H01R 13/2407* (2013.01); *H01R 13/447* (2013.01); *H01R 13/506* (2013.01); *H01R 13/518* (2013.01); *H01R 13/6275* (2013.01); *H05K 5/0239* (2013.01); *H05K 7/1461* (2013.01); *H05K 7/1488* (2013.01)

(58) Field of Classification Search
CPC ..... H01R 13/44; H01R 13/443; H01R 13/447
USPC ........................................... 361/679.4, 679.6
See application file for complete search history.

(56) References Cited

U.S. PATENT DOCUMENTS

| | | | | |
|---|---|---|---|---|
| 5,191,544 | A * | 3/1993 | Benck | G06F 1/181 174/362 |
| 5,199,776 | A * | 4/1993 | Lin | G06F 1/181 312/242 |
| 6,102,501 | A * | 8/2000 | Chen | G06F 1/181 312/223.2 |
| 6,166,325 | A * | 12/2000 | Wu | H05K 9/0039 174/377 |
| 6,278,606 | B1 * | 8/2001 | Schmitt | G06F 1/182 312/223.2 |
| 6,307,756 | B1 * | 10/2001 | Liu | H01R 13/6582 361/816 |
| 6,330,139 | B1 * | 12/2001 | Liao | G06F 1/181 174/365 |
| 6,587,349 | B1 * | 7/2003 | Chen | G06F 1/181 361/752 |
| 6,954,354 | B2 * | 10/2005 | Shyr | G06F 1/183 312/223.1 |
| 7,430,126 | B2 * | 9/2008 | Ng | G06F 1/181 361/752 |
| 7,723,621 | B2 * | 5/2010 | Megason | H05K 9/0016 174/354 |

(Continued)

*Primary Examiner* — Adrian S Wilson
(74) *Attorney, Agent, or Firm* — ScienBiziP, P.C.

(57) ABSTRACT

An input/output (I/O) panel assembly is adapted to be mounted to a computer chassis. The I/O panel assembly includes a wall panel defining a number of openings adapted to receive different I/O connectors. At least one securing plate is removably mounted to the wall panel to cover the number of openings.

15 Claims, 3 Drawing Sheets

(56) References Cited

U.S. PATENT DOCUMENTS

| | | | |
|---|---|---|---|
| 7,976,346 B2* | 7/2011 | Guy | H01R 13/2421 |
| | | | 439/638 |
| 8,934,224 B2* | 1/2015 | Iwamoto | H01R 13/447 |
| | | | 292/11 |
| 2014/0037259 A1* | 2/2014 | Bragg | H01R 13/659 |
| | | | 385/135 |

* cited by examiner

INPUT/OUTPUT PANEL ASSEMBLY

FIELD

The subject matter herein generally relates to input/output (I/O) panel assemblies, and more particularly to an I/O panel assembly compatible with different kinds of I/O connectors.

BACKGROUND

Server systems generally require multiple kinds of input/output (I/O) ports for receiving different I/O connectors. A chassis of a server system may need to be modified to accept different kinds of I/O connectors.

BRIEF DESCRIPTION OF THE DRAWINGS

Implementations of the present disclosure will now be described, by way of example only, with reference to the attached figures.

DETAILED DESCRIPTION

Figure 1:
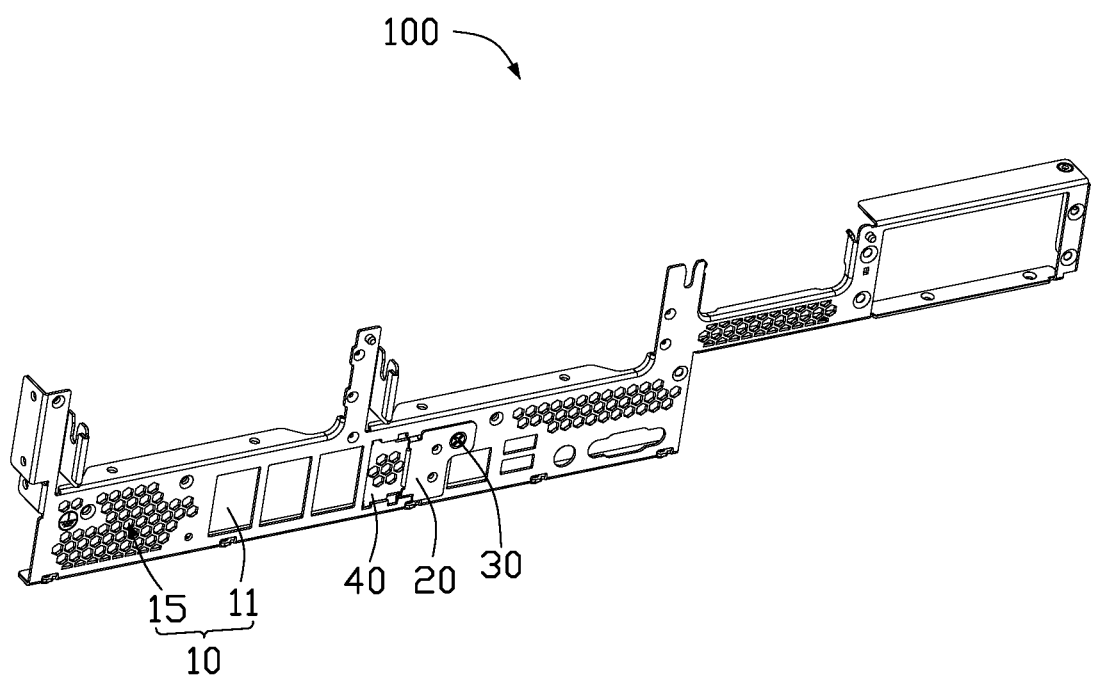
FIG. 1 is an isometric view of an embodiment of an input/output (I/O) panel assembly.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
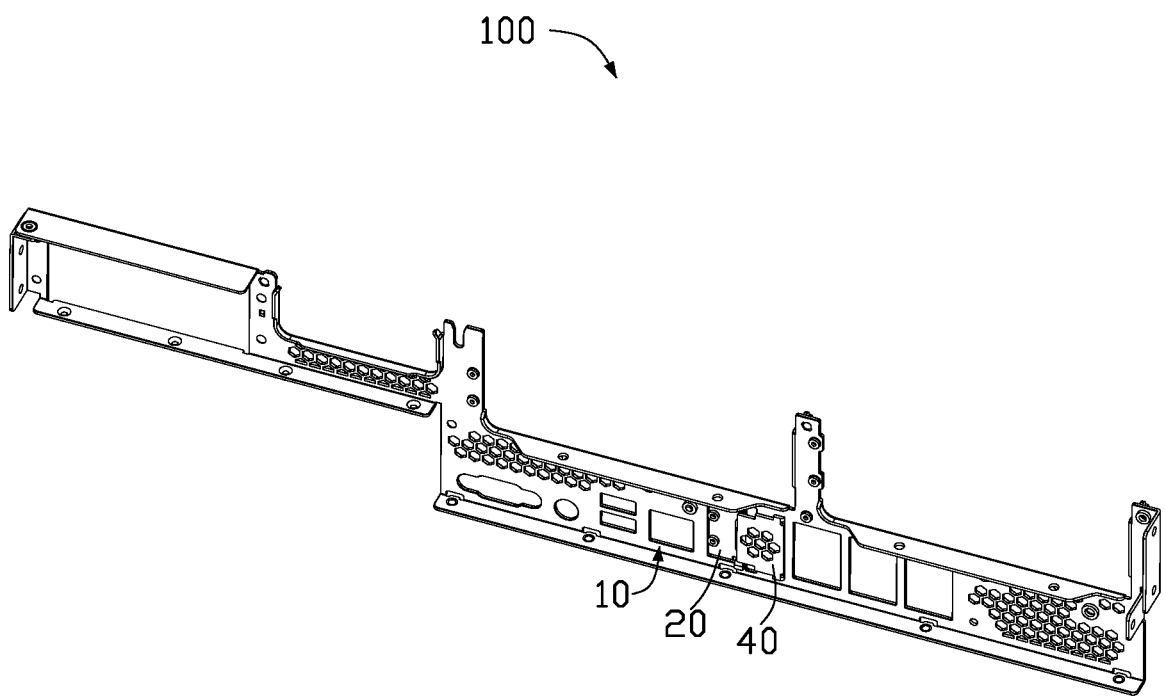
FIG. 2 shows the I/O panel assembly in FIG. 1 from another perspective.

FIG. 1 and FIG. 2 show an embodiment of an input/output (I/O) panel assembly 100 adapted to be mounted to a computer chassis (not shown). In one embodiment, the computer chassis is a chassis of a server system. The I/O panel assembly 100 includes a wall panel 10 and at least one securing plate 20. The I/O panel assembly 100 can also include at least one cover plate 40. The wall panel 10 defines a plurality of openings 11 to receive different I/O connectors (not shown). Each of the openings 11 can mount at least one I/O connector therein. The securing plate 20 and the cover plate 40 are each coupled to the wall panel 10. In one embodiment, a quantity of the openings 11 is four, but may be more or less in other embodiments. In one embodiment, a quantity of the at least one securing plate 20 and the at least one cover plate 40 is one, but may be more in other embodiments. In one embodiment, the securing plate 20 and the cover plate 40 cooperatively cover one of the plurality of openings 11 to enhance an electromagnetic shielding effect. The securing plate 20 or the cover plate 40 is removed from the wall panel 10 to reveal the at least one opening 11 and to mount the I/O connector within the opening 11.

Figure 3:
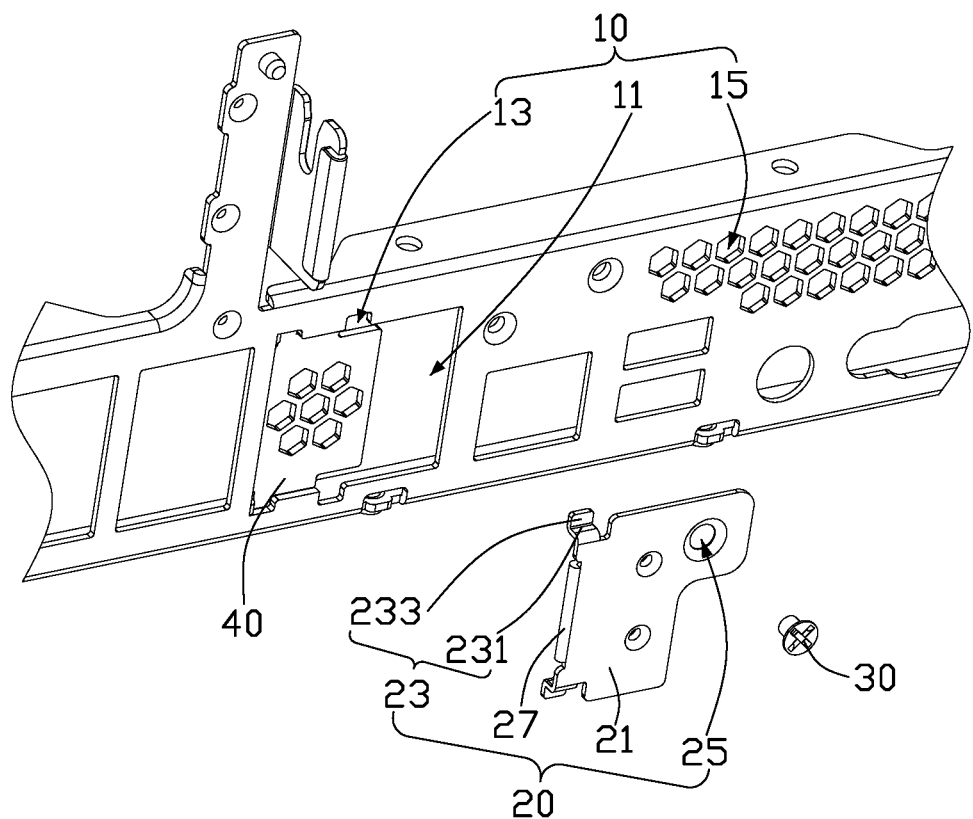
FIG. 3 is a partially exploded view of the I/O panel assembly in FIG. 1.

As shown in FIG. 3, the securing plate 20 includes a main body 21. At least two clips 23 respectively extend from opposite side edges of the main body 21. The wall panel 10 defines a plurality of latching slots 13. In one embodiment, each of the plurality of openings 11 is in communication with two corresponding latching slots 13. The clips 23 respectively pass through the two latching slots 13 to mount the clips 23 and the main body 21 to the wall panel 10. The clips 23 are adapted to slide along the wall panel 10 after passing through the respective two latching slots 13 to mount the clips 23 and the main body 21 to the wall panel 10.

As shown in FIG. 3, each clip 23 includes a connecting portion 231 and a hook portion 233. The connecting portion 231 is coupled to the main body 21 and extends substantially perpendicularly from the main body 21. The hook portion 233 extends from an end of the connecting portion 231. A width of the connecting portion 231 and the hook portion 233 is less than a width of the latching slot 13. Thus, the clip 23 passes through the latching slot 13 to clip a side of the wall panel 10 opposite to the main body 21. A distance between the hook portion 233 and the main body 21 is less than a thickness of the I/O panel assembly 100. Thus, the hook portion 233 latches the securing plate 20 to the wall panel 10.

In other embodiments, a distance between the hook portion 233 and the main body 21 can be equal to or greater than the thickness of the wall panel 10, and a quantity of the hook portions 233 can be one, three, or more than three as long as the clips 23 can clip the securing plate 20 to the wall panel 10.

The securing plate 20 defines at least one fastening hole 25. A fastener 30 passes through the at least one fastening hole 25 to fasten the securing plate 20 to the wall panel 10. In one embodiment, the fastener 30 is a screw, but is not limited thereto. In other embodiments, the fastener 30 can be omitted such that the securing plate 20 is mounted to the wall panel 10 by the clips 23.

The cover plate 40 is coupled to the wall panel 10 by punching, such that when the wall panel 10 is impacted, the cover plate 40 does not fall off the wall panel 10. The cover plate 40 is mounted to the wall panel 10 between the wall panel 10 and the securing plate 20. The securing plate 20 includes an abutting portion 27 adapted to abut the cover plate 40 and to reduce a gap between the securing plate 20 and the cover plate 40, thus enhancing electromagnetic shielding.

The wall panel 10 defines a plurality of cooling holes 15 adapted to transmit heat generated by components from within the computer chasses.

In one embodiment, size dimensions of the plurality of openings 11 match size dimensions of different I/O connectors.

In other embodiments, the cover plate 40 may be omitted, such that the securing plate 20 covers the plurality of openings 11, and the abutting portion 27 abuts the wall panel 10.

In other embodiment, each of the securing plate 20 and the cover plate 40 can cover different openings 11.

When the opening 11 does not have an I/O connector received therein, the cover plate 40 is coupled to the wall panel 10 by punching to cover the opening 11. The main body 21 of the securing plate 20 abuts the wall panel 10. The abutting portion 27 of the securing plate 20 abuts the cover plate 40. The clips 23 of the securing plate 20 pass through the latching slots 13 and slide along the wall panel 10 to mount the securing plate 20 to the wall panel 10. The fastener 30 passes through the fastening hole 25 to fasten the securing plate 20 to the wall panel 10. The securing plate 20 and the cover plate 40 cover one of the plurality of openings 11.

When the covered opening 11 receives an I/O connector therein, the cover plate 40 is impacted by an external force to be removed from the wall panel 10 to reveal the opening 11. In another embodiment, the fastener 30 is removed from the securing plate 20, and the main body 21 is slid along the wall panel 10 until the clips 23 can be removed from the latching slots 13 to remove the securing plate 20 from the wall panel 10.

The I/O panel assembly 100 uses at least one securing plate 20 and/or at least one cover plate 40 to cover the openings 11 and to enhance electromagnetic shielding. When the opening 11 receives the I/O connector, the securing plate 20 and/or the cover plate 40 are removed.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. An input/output (I/O) panel assembly adapted to be mounted to a computer chassis, the I/O panel assembly comprising:
   a wall panel defining a plurality of openings to receive different I/O connectors;
   at least one securing plate removably mounted to the wall panel to cover the plurality of openings;
   the wall panel defines a plurality of latching slots;
   wherein each of the plurality of openings is in communication with at least two corresponding latching slots;
   the at least one securing plate comprises a main body and at least two clips;
   the at least two clips respectively extend from opposite side edges of the main body;
   the at least two clips of the securing plate extend through the at least two latching slots of a corresponding one of the plurality of openings, and the at least two clips are configured to slide along the wall panel after extending through the respective two latching slots thereby mounting the clips and the main body to the wall panel.

2. The I/O panel assembly of claim 1, wherein:
   each clip comprises a connecting portion and a hook portion;
   the connecting portion is coupled to the main body and extends perpendicularly from the main body;
   the hook portion extends from an end of the connecting portion;
   a width of the connecting portion and the hook portion is less than a width of the latching slot.

3. The I/O panel assembly of claim 2, wherein a distance between the hook portion and the main body is less than a thickness of the wall panel.

4. The I/O panel assembly of claim 1, wherein:
   the securing plate defines at least one fastening hole;
   at least one fastener passes through the at least one fastening hole, and the fastener fastens the securing plate to the wall panel.

5. The I/O panel assembly of claim 1 further comprising a cover plate, the cover plate and the securing plate cooperatively mount to the wall panel and cover at least one of the plurality of openings.

6. The I/O panel assembly of claim 5, wherein:
   the cover plate is coupled to the wall panel by punching;
   the cover plate is removed from the wall panel when the wall panel is impacted.

7. The I/O panel assembly of claim 5, wherein:
   the cover plate is mounted to the wall panel between the wall panel and the securing plate;
   the securing plate comprises an abutting portion to abut the cover plate.

8. The I/O panel assembly of claim 1, wherein each of the plurality of openings is adapted to receive at least one I/O connector.

9. The I/O panel assembly of claim 1, wherein the wall panel defines a plurality of cooling holes to transmit heat.

10. An input/output (I/O) panel assembly mountable to a computer chassis, the I/O panel assembly comprising:
    a wall panel defining a plurality of openings to receive different I/O connectors;
    at least one securing plate removably mounted to the wall panel to cover the plurality of openings;
    the wall panel defines a plurality of latching slots;
    wherein each of the plurality of openings is in communication with at least two corresponding ones of the plurality of latching slots;
    at least two clips respectively extend from opposite side edges of the at least one securing plate;
    each of the at least two clips comprises a connecting portion and a hook portion;
    the connecting portion is coupled to the securing plate and extends perpendicularly from the securing plate;
    the hook portion extends from an end of the connecting portion;
    the hook portions extends through the at least two latching slots, and the connecting portions slide along sides of the opening so that the hook portion latches the securing plate to the wall panel.

11. The I/O panel assembly of claim 10 further comprising a cover plate, wherein the cover plate and the securing plate cooperatively mount to the wall panel and cover at least one of the plurality of openings.

12. The I/O panel assembly of claim 11, wherein the cover plate defines a plurality of cooling holes configured to transmit heat.

13. The I/O panel assembly of claim 11, wherein:
    the cover plate is mounted to the wall panel between the wall panel and the securing plate;

the securing plate comprises an abutting portion to abut the cover plate.

14. The I/O panel assembly of claim 11, wherein:

the cover plate is coupled to the wall panel by punching;

the cover plate is removable from the wall panel when the wall panel is impacted.

15. The I/O panel assembly of claim 10, wherein:

the securing plate defines at least one fastening hole;

at least one fastener extended through the at least one fastening hole, and the fastener fastens the securing plate to the wall panel.

* * * * *